(12) United States Patent
Chiu et al.

(10) Patent No.: US 11,961,833 B2
(45) Date of Patent: Apr. 16, 2024

(54) HIGH VOLTAGE DEVICE AND MANUFACTURING METHOD THEREOF

(71) Applicant: Richtek Technology Corporation, Zhubei (TW)

(72) Inventors: Kuo-Chin Chiu, Hsinchu (TW); Chien-Wei Chiu, Yunlin (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 281 days.

(21) Appl. No.: 17/702,702

(22) Filed: Mar. 23, 2022

(65) Prior Publication Data
US 2022/0336441 A1 Oct. 20, 2022

(30) Foreign Application Priority Data
Apr. 19, 2021 (TW) .................................. 110114006

(51) Int. Cl.
*H01L 27/02* (2006.01)
*H01L 21/8234* (2006.01)
*H01L 21/761* (2006.01)

(52) U.S. Cl.
CPC .. *H01L 27/0255* (2013.01); *H01L 21/823481* (2013.01); *H01L 27/0288* (2013.01); *H01L 21/761* (2013.01)

(58) Field of Classification Search
None
See application file for complete search history.

(56) References Cited

U.S. PATENT DOCUMENTS

| | | | | |
|---|---|---|---|---|
| 2006/0186467 A1* | 8/2006 | Pendharkar | ........... | H01L 29/749 257/E27.06 |
| 2007/0007545 A1* | 1/2007 | Salcedo | .............. | H01L 27/0262 257/127 |
| 2010/0073039 A1* | 3/2010 | Kanai | ................. | H02M 7/5387 327/110 |
| 2011/0260246 A1* | 10/2011 | Disney | ................ | H01L 29/7811 257/E29.256 |
| 2014/0167106 A1* | 6/2014 | Salcedo | .................. | H01L 29/78 257/146 |

* cited by examiner

*Primary Examiner* — Bilkis Jahan
(74) *Attorney, Agent, or Firm* — Tung & Associates (57) ABSTRACT

A high voltage device is used as a lower switch in a power stage of a switching regulator. The high voltage device includes at least one lateral diffused metal oxide semiconductor (LDMOS) device, a first isolation region, a second isolation region, a third isolation region, and a current limiting device. The first isolation region is located in a semiconductor layer, and encloses the LDMOS device. The second isolation region has a first conductivity type, and encloses the first isolation region in the semiconductor layer. The third isolation region has a second conductivity type, and encloses the second isolation region in the semiconductor layer. The current limiting device is electrically connected to the second isolation region, and is configured to operably suppress a parasitic silicon controlled rectifier (SCR) from being turned on.

10 Claims, 5 Drawing Sheets

Fig. 4

HIGH VOLTAGE DEVICE AND MANUFACTURING METHOD THEREOF

CROSS REFERENCE

The present invention claims priority to TW 110114006 filed on Apr. 19, 2021.

BACKGROUND OF THE INVENTION

Field of Invention

The present invention relates to a high voltage device and a manufacturing method thereof; particularly, it relates to such high voltage device for use in a switching regulator, wherein the high voltage device is capable of suppressing a parasitic silicon controlled rectifier (SCR) from being turned on, and a manufacturing method thereof.

Description of Related Art

Figure 1:
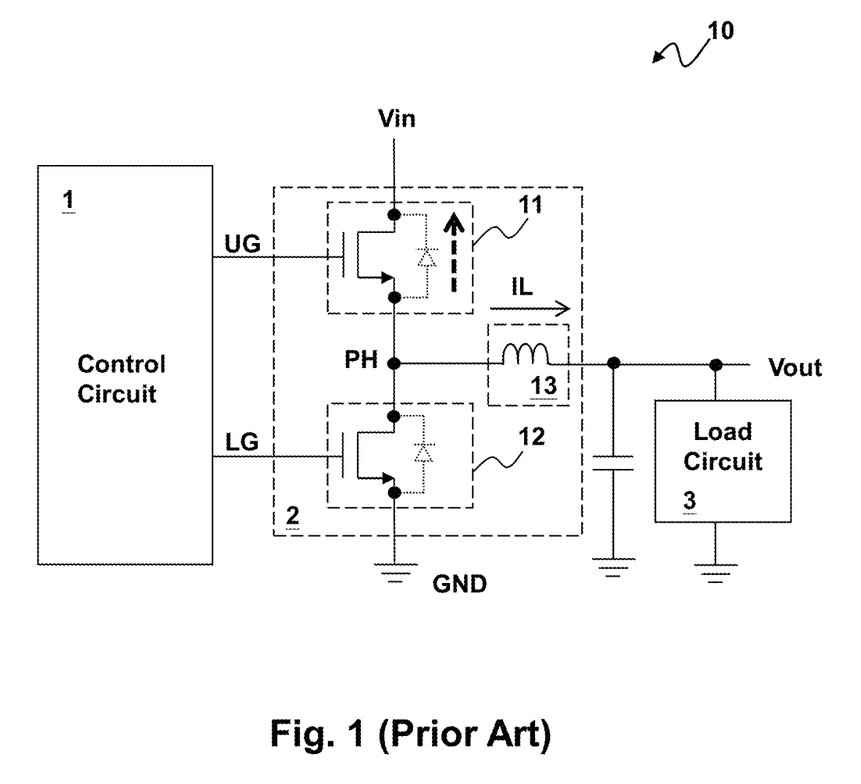
FIG. 1 shows a schematic diagram of a typical switching regulator.

Please refer to FIG. 1, which shows a schematic diagram of a typical switching regulator. The switching regulator 10 includes a control circuit 1 and a power stage circuit 2. As shown in FIG. 1, the power stage circuit 2 includes a high voltage device 11 serving as a high-side switch and a high voltage device 12 serving as a low-side switch. The high-side switch and the low-side switch operate according to a high-side signal UG and a low-side signal LG respectively, to convert an input voltage Vin to an output voltage Vout, and to generate an inductor current IL flowing through an inductor 13 in the power stage circuit 2.

The prior art shown in FIG. 1 has the following drawback. When the high voltage device 12 operates, in a case when the load 3 is in a light load condition, the inductor current IL may become a negative current under certain situation and the negative inductor current IL will flow through the high voltage device 11 as shown by a thick dashed arrow in FIG. 1, turning ON a silicon controlled rectifier (SCR) which lies between the high voltage device 12 and the high voltage device 11, thus resulting in error operation and damaging the high voltage device 11 and the high voltage device 12. The above-mentioned drawback limits the safe operation area (SOA) and the application scope of the switching regulator 10. ("Safe operation area (SOA)" is well known to those skilled in the art, so the details thereof are not redundantly explained here.)

In view of the above, to overcome the drawback in the prior art, the present invention proposes a high voltage device and a manufacturing method thereof, wherein the high voltage device is capable of suppressing a parasitic SCR from being turned on. Besides, the present invention can enhance SOA, thus broadening the application scope.

SUMMARY OF THE INVENTION

From one perspective, the present invention provides a high voltage device for use as a low-side switch in a power stage of a switching regulator, the high voltage device comprising: at least one lateral diffused metal oxide semiconductor (LDMOS) device, wherein the LDMOS device includes: a well, which has a first conductivity type, and is formed in a semiconductor layer; a body region, which has a second conductivity type, and is formed in the well; a gate, which is formed on the body region and is connected to the body region; and a source and a drain, which have the first conductivity type, and are located at different sides out of the gate respectively, wherein the source is located in the body region, and the drain is located in the well; and a first isolation region, which has the second conductivity type, and is formed in the semiconductor layer, wherein the first isolation region encloses the LDMOS device; a second isolation region, which has the first conductivity type, and is formed in the semiconductor layer, wherein the second isolation region encloses the first isolation region; a third isolation region, which has the second conductivity type, and is formed in the semiconductor layer, wherein the third isolation region encloses the second isolation region; a current limiting device, which is electrically connected to the second isolation region and which is configured to operably suppress a parasitic silicon controlled rectifier (SCR) from being turned on; wherein part of the body region, which is between the source and a boundary of the body region, and is right below the gate, forms an inversion region which serves as an inversion current channel in an ON operation of the LDMOS device; wherein part of the well between the body region and the drain is a drift region, which serves as a drift current channel in the ON operation of the LDMOS device.

From another perspective, the present invention provides a manufacturing method of a high voltage device, wherein the high voltage device is for use as a low-side switch in a power stage of a switching regulator, the manufacturing method comprising: forming at least one lateral diffused metal oxide semiconductor (LDMOS) device, by manufacturing steps including: forming a well in a semiconductor layer, wherein the well has a first conductivity type; forming a body region in the well, wherein the body region has a second conductivity type; forming a gate on the body region and in contact with the body region; and forming a source and a drain having the first conductivity, wherein the source and the drain are located at different sides out of the gate respectively, wherein the source is located in the body region, and the drain is located in the well; forming a first isolation region having the second conductivity type in the semiconductor layer, wherein the first isolation region encloses the LDMOS device; forming a second isolation region having the first conductivity type in the semiconductor layer, wherein the second isolation region encloses the first isolation region; forming a third isolation region having the second conductivity type in the semiconductor layer, wherein the third isolation region encloses the second isolation region; and forming a current limiting device, wherein the current limiting device is electrically connected to the second isolation region and is configured to operably suppress a parasitic silicon controlled rectifier (SCR) from being turned on; wherein part of the body region, which is between the source and a boundary of the body region, and is right below the gate, forms an inversion region which serves as an inversion current channel in an ON operation of the LDMOS device; wherein part of the well between the body region and the drain is a drift region, which serves as a drift current channel in the ON operation of the LDMOS device.

In one embodiment, the current limiting device includes: a Schottky barrier diode (SBD), a resistor device or a PN diode.

In one embodiment, the current limiting device includes a SBD, and the SBD includes: a Schottky metal unit, which is formed on the second isolation region; and a Schottky semiconductor unit, which is formed in the second isolation region, wherein a Schottky contact is formed between the Schottky semiconductor unit and the Schottky metal unit, and wherein part of the second isolation region serves as the Schottky semiconductor unit.

In one embodiment, the second isolation region is a ring-shape region from a top view, and wherein a portion of the ring-shape region which is nearer to a high-side switch in the power stage serves as the Schottky semiconductor unit.

In one embodiment, the portion is at least ¼ of the ring-shape region

Advantages of the present invention include: that the present invention can suppress a parasitic SCR from being turned on; and that the present invention can enhance SOA, thus broadening the application scope.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, but the shapes, thicknesses, and widths are not drawn in actual scale.

Figure 2A:
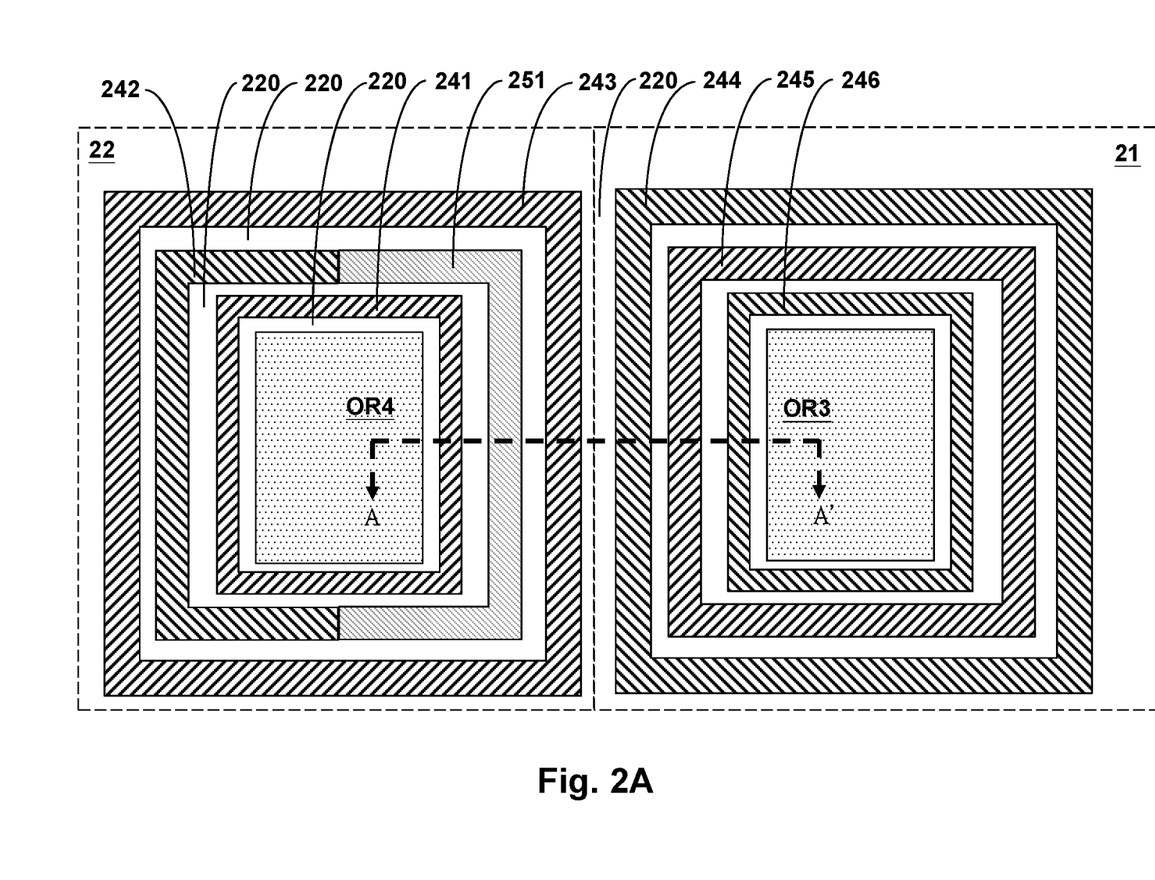
FIG. 2A shows a schematic diagram of a top view of a high voltage device for use as a low-side switch according to an embodiment of the present invention.
Figure 2B:
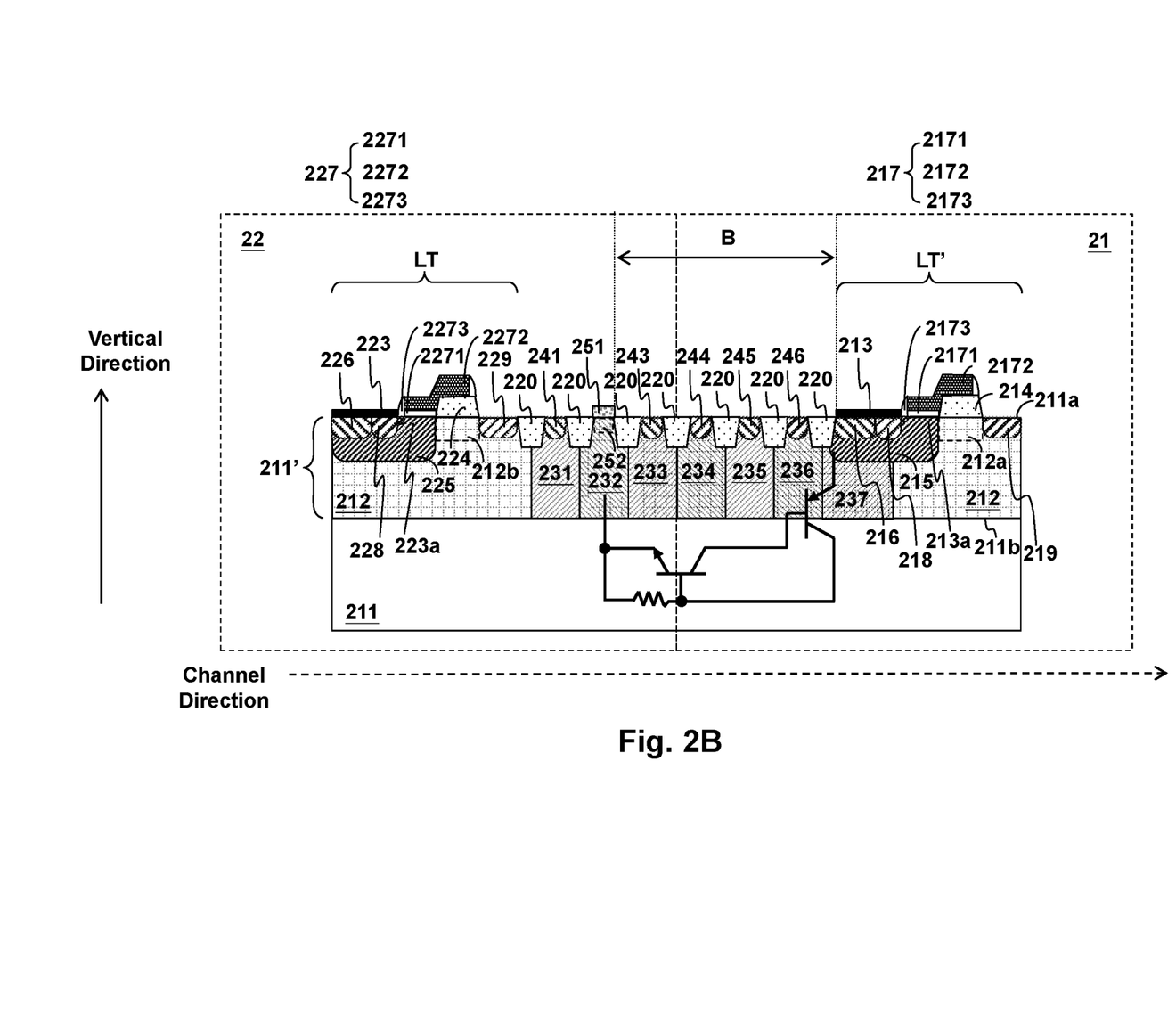
FIG. 2B shows a schematic diagram of a cross-section view of a high voltage device for use as a low-side switch according to an embodiment of the present invention.

Please refer to FIG. 2A and FIG. 2B. FIG. 2A shows a schematic diagram of a top view of a high voltage device 21 for use as a high-side switch in a switching regulator and a high voltage device 22 for use as a low-side switch in a switching regulator according to an embodiment of the present invention. FIG. 2B shows a schematic diagram of a cross-section view of the high voltage device 21 and the high voltage device 22. FIG. 2B is a cross sectional view of an operation area OR3 and an operation area OR4 taken along A-A' line of FIG. 2A. As show in FIG. 2A and FIG. 2B, the high voltage device 22 for use as a low-side switch includes: a lateral diffused metal oxide semiconductor (LDMOS) device LT, a current limiting device (Schottky barrier diodes (SBD) in this embodiment) 251, a first isolation region 231, a second isolation region 232 and a third isolation region 233. The high voltage device 21 for use as a high-side switch includes: a lateral diffused metal oxide semiconductor (LD-MOS) device LT', a fourth isolation region 234, a fifth isolation region 235 and a sixth isolation region 236. The LDMOS device LT includes: a well 212, a drift oxide region 224, a body region 225, a body contact 226, a gate 227, a source 228, and a drain 229. The LDMOS device LT' includes: a well 212, a drift oxide region 214, a body region 211, a body contact 216, a gate 217, a source 218, a drain 219, and a high voltage well 237.

In the high voltage device 21 and the high voltage device 22, a semiconductor layer 211' is formed on a substrate 211. The semiconductor layer 211' has a top surface 211a and a bottom surface 211b opposite to the top surface 211a in a vertical direction (as indicated by the direction of the solid arrow in FIG. 2B). The substrate 211 is, for example but not limited to, a P-type or N-type semiconductor substrate. The semiconductor layer 211', for example, is formed on the substrate 211 by an epitaxial process step, or is a part of the substrate 211. The semiconductor layer 211' can be formed by various methods known to a person having ordinary skill in the art, so the details thereof are not redundantly explained here.

Please still refer to FIG. 2B. The drift oxide region 224 and the drift oxide region 214 are formed on and in contact with the top surface 211a, and are located on and in contact with part of the drift region 222a and part of the drift region 212a respectively (wherein the drift regions are indicated by the dashed line frame in the LDMOS device LT and the dashed line frame in the LDMOS device LT' shown in FIG. 2B). In this embodiment, the drift oxide region 224 and the drift oxide region 214 are local oxidation of silicon (LO-COS) structures as shown in the figure; in another embodiment, the drift oxide region 224 and the drift oxide region 214 can be shallow trench isolation (STI) structures.

The well 212 has a first conductivity type, and is formed in the semiconductor layer 211'. The well 212 is located beneath the top surface 211a and is in contact with the top surface 211a in the vertical direction. The well 212 is formed by for example but not limited to at least one ion implantation process step. The body region 225 and the body region 215 have a second conductivity type, and are formed in the well 212. The body region 225 and the body region 215 are located beneath and in contact with the top surface 211a in the vertical direction. The body contact 226 and the body contact 216 have the second conductivity type, and serve as electrical contacts of the body region 225 and the body region 215, respectively. The body contact 226 and the body contact 216 are formed in the body region 225 and the body region 215, respectively, beneath the top surface 211a and in contact with the top surface 211a in the vertical direction. The gate 227 and the gate 217 are formed on the top surface 211a of the semiconductor layer 211'. Part of the body region 225 located right below the gate 227 defines an inversion region 223a, which serves as an inversion current channel in the ON operation of the high voltage device 22. Part of the body region 215 located right below the gate 217 defines an inversion region 213a, which serves as an inversion current channel in the ON operation of the high voltage device 21.

Please still refer to FIG. 2B. The source 228, the source 218, the drain 229, and the drain 229 have the first conductivity type. The source 228 and the drain 229 are formed beneath the top surface 211a and in contact with the top surface 211a in the vertical direction. The source 218 and the drain 219 are formed beneath the top surface 211a and in contact with the top surface 211a in the vertical direction. The source 228 and the drain 229 are located at two different sides out of the gate 227 respectively, wherein the source 228 is located in the body region 225, and the drain 229 is located in the well 212 which is away from the body region 225. The source 218 and the drain 219 are located at two different sides out of the gate 217 respectively, wherein the source 218 is located in the body region 215, and the drain 219 is located in the well 212 which is away from the body region 215. In a channel direction (as indicated by the direction of the dashed arrow in FIG. 2B), part of the well 212 which is near the top surface 211a, and between the body region 225 and the drain 229, defines a drift region 212b. The drift region 212b serves as adrift current channel in the ON operation of the LDMOS device LT. In the channel direction, part of the well 212 which is near the top surface 211a, and between the body region 215 and the drain 219, defines ae drift region 212a. The drift region 212a serves as a drift current channel in the ON operation of the LDMOS device LT'.

Note that the term "inversion current channel" 223a or 213a means thus. Taking this embodiment as an example, when the LDMOS device LT or LT' operates in the ON operation due to the voltage applied to the gate 227 or 217, an inversion layer is formed beneath the gate 227 or 217, between the source 228 or 218 and the drift region 212b or 212a, so that a conduction current flows through the region of the inversion layer, which is the inversion current channel known to a person having ordinary skill in the art.

Note that the first conductivity type can be P-type or N-type; when the first conductivity type is P-type, the second conductivity type is N-type, and when the first conductivity type is N-type, the second conductivity type is P-type.

Note that the term "drift current channel" means thus. Taking this embodiment as an example, the drift region refers to a region where the conduction current passes through in a drifting manner when the high voltage device 21 or 22 operates in the ON operation, which is known to a person having ordinary skill in the art.

Note that the gate 227 as defined in the context of this invention includes: a dielectric layer 2271 in contact with the top surface 211a, a conductive layer 2272 which is conductive, and a spacer layer 2273 which is electrically insulative. The dielectric layer 2271 is formed on the body region 225 and the well 212, and is in contact with the body region 225 and the well 212. The conductive layer 2272 serves as an electrical contact of the gate 227, and is formed on the dielectric layer 2271 and in contact with the dielectric layer 2271. The spacer layer 2273 is formed out of two sides of the conductive layer 2272, as an electrically insulative layer of the gate 227. Likely, the gate 217 as defined in the context of this invention includes: a dielectric layer 2171 in contact with the top surface 211a, a conductive layer 2172 which is conductive, and a spacer layer 2173 which is electrically insulative. The dielectric layer 2171 is formed on the body region 215 and the well 212, and is in contact with the body region 215 and the well 212. The conductive layer 2172 serves as an electrical contact of the gate 217, and is formed on the dielectric layer 2171 and in contact with the dielectric layer 2171. The spacer layer 2173 is formed out of two sides of the conductive layer 2172, as an electrically insulative layer of the gate 217. As shown in FIG. 2B, the high voltage well 237 has a second conductivity type, and is formed below the body region 215 and is near to the well 212.

In addition, the term "high voltage" device means that, when the device operates in normal operation, the voltage applied to the drain is higher than a specific voltage, such as 5V; for devices of different high voltages, a lateral distance (distance of the drift region 212b or 212a) between the body region 225 or 215 and the drain 229 or 219 can be determined according to the operation voltage that the device is designed to withstand during normal operation, which is known to a person having ordinary skill in the art.

Please still refer to FIG. 2B. The first isolation region 231 has the second conductivity type, and is formed in the semiconductor layer 211'. The first isolation region 231 encloses the LDMOS device LT. The second isolation region 232 has the first conductivity type, and is formed in the semiconductor layer 211'. The second isolation region 232 encloses the first isolation region 231. The third isolation region 233 has the second conductivity type, and is formed in the semiconductor layer 211'. The third isolation region 233 encloses the second isolation region 232. The current limiting device 251 is electrically connected to a top surface 211a of the second isolation region 232 and the current limiting device 251 is configured to operably suppress a parasitic SCR from being turned on, thus enhancing the SOA and broadening the application scope of the high voltage devices 21 and 22. Referring to FIG. 2B, because of the current limiting device 251, a parasitic NPN transistor as shown in the figure will not be turned on, so that the SCR is suppressed from being turned on. In one embodiment, the current limiting device 251 includes a Schottky barrier diode (SBD), a resistor device or a PN diode. As shown in FIG. 2B, a distance between an edge of the current limiting device 251 and an edge of the body contact 216 of the high voltage device 21 is defined as the distance B, and in one embodiment, preferably, the distance B is 66 micrometer (μm).

In one embodiment, in a case when the current limiting device 251 is implemented as a SBD, the SBD includes: a Schottky metal unit and a Schottky semiconductor unit 252. The Schottky metal unit is formed on the second isolation region 232, whereas, the Schottky semiconductor unit is formed in the second isolation region 232. A Schottky contact is formed between the Schottky semiconductor unit 252 and the Schottky metal unit. In one embodiment, part of the second isolation region 232 serves as the Schottky semiconductor unit 252. As shown in FIG. 2A, in one embodiment, the second isolation region 232 is a ring-shape region from a top view. A portion of the ring-shape region (referred to as "nearer portion") which is nearer to a high-side switch in the power stage serves to form the Schottky semiconductor unit 252. There is a second isolation region contact point 242 on the second isolation region 232a, but on the nearer portion of the second isolation region 232a, the second isolation region contact point 242 is omitted and part of the current limiting device 251 is formed, which can be for example but not limited to a Schottky metal unit. The second isolation region contact point 242 is provided on the rest of the second isolation region 232. In another embodiment, the aforementioned nearer portion can cover the entire ring-shape region. In a preferred embodiment, the nearer portion covers at least ¼ of the ring-shape region. In one embodiment, preferably, the aforementioned nearer portion covers at least ½ of the ring-shape region.

In one embodiment, the Schottky metal unit is electrically connected to a bias voltage. In one embodiment, preferably, the Schottky metal unit is electrically connected to a current outflow end of a power stage circuit. In one embodiment, preferably, the Schottky metal unit is electrically connected to an output end of a power stage circuit.

The first isolation region 231 and the third isolation region 233 have a first isolation region contact point 241 and a third isolation region contact point 243, respectively. Along the vertical direction of FIG. 2B, the first isolation region contact point 241 is formed beneath a top surface of the first isolation region 231, and is electrically connected to the first isolation region 231, whereas, the third isolation region contact point 243 is formed beneath a top surface of the third isolation region 233, and is electrically connected to the third isolation region 233. Along the channel direction, an insulation structure 220 lies between the drain 229 and the first isolation region contact point 241, an insulation structure 220 lies between the first isolation region contact point 241 and the current limiting device 251, and an insulation structure 220 lies between the current limiting device 251 and the third isolation region contact point 243, wherein the above-mentioned insulation structures 220 are formed beneath and in contact with the top surface 211a.

The sixth isolation region 236 has the first conductivity type, and is formed in the semiconductor layer 211'. The sixth isolation region 236 encloses a high voltage well 237 of the LDMOS device LT'. The fifth isolation region 235 has the second conductivity type, and is formed in the semiconductor layer 211'. The fifth isolation region 235 encloses the sixth isolation region 236. The fourth isolation region 234 has the first conductivity type, and is formed in the semiconductor layer 211'. The fourth isolation region 234 encloses the fifth isolation region 235 and is near to the third isolation region 233. The fourth isolation region 234, the fifth isolation region 235 and the sixth isolation region 236 have a fourth isolation region contact point 244, a fifth isolation region contact point 245 and a sixth isolation region contact point 246, respectively. Along the vertical direction of FIG. 2B, the fourth isolation region contact point 244 is formed beneath a top surface of the fourth isolation region 234, and is electrically connected to the fourth isolation region 234. Along the vertical direction of FIG. 2B, the fifth isolation region contact point 245 is formed beneath a top surface of the fifth isolation region 235, and is electrically connected to the fifth isolation region 235. Along the vertical direction of FIG. 2B, the sixth isolation region contact point 246 is formed beneath a top surface of the sixth isolation region 236, and is electrically connected to the sixth isolation region 236.

Along the vertical direction of FIG. 2B, an insulation structure 220 lies between the body contact 216 and the sixth isolation region contact point 246, an insulation structure 220 lies between the sixth isolation region contact point 246 and the fifth isolation region contact point 245, an insulation structure 220 lies between the fifth isolation region contact point 245 and the fourth isolation region contact point 244, and an insulation structure 220 lies between the fourth isolation region contact point 244 and the third isolation region contact point 243, wherein the above-mentioned insulation structures 220 are formed beneath and in contact with the top surface 211a. Each of the high voltage device 21 and the high voltage device 22 can further include the substrate 211. The substrate 211 has the second conductivity type, and encompasses the bottoms of the well 212, the first isolation region 231, the second isolation region 232, the third isolation region 233, the fourth isolation region 234, the fifth isolation region 235, the sixth isolation region 236 and the high voltage well 237. In one embodiment, in the LDMOS device LT, the source 228 and the body contact 226 are electrically connected to each other via a metal silicide layer 223, as shown in FIG. 2B. In one embodiment, in the LDMOS device LT', the source 218 and the body contact 216 are electrically connected to each other via a metal silicide layer 213, as shown in FIG. 2B.

One feature of the present invention which is advantageous over the prior art is that: taking the embodiment of FIG. 2B as an example, the high voltage device 22 of the present invention includes a current limiting device 251, which is located on the second isolation region 232, whereby the present invention can suppress a parasitic SCR from being turned on. Besides, the present invention can enhance SOA, thus broadening the application scope.

Figure 3:
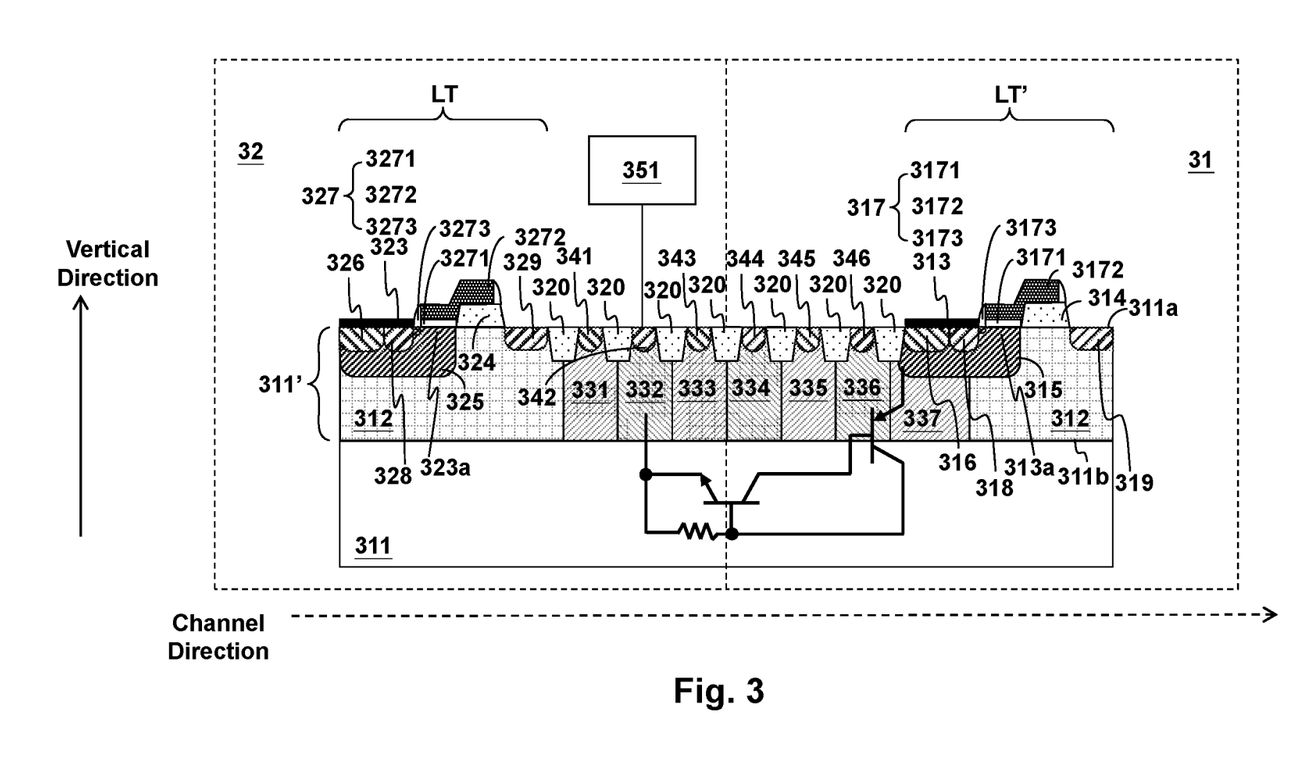
FIG. 3 shows a schematic diagram of a cross-section view of a high voltage device for use as a low-side switch according to another embodiment of the present invention.

Please refer to FIG. 3, which shows a schematic diagram of a cross-section view of a high voltage device 31 for use as a high-side switch and a high voltage device 32 for use as a low-side switch according to another embodiment of the present invention. This embodiment shown in FIG. 3 is different from the embodiment shown in FIG. 2, in that: the current limiting device 351 of the embodiment shown in FIG. 3 is externally coupled to the second isolation region contact point 342. The LDMOS device LT, the LDMOS device LT', the first isolation region 331, the second isolation region 332, the third isolation region 333, the fourth isolation region 334, the fifth isolation region 335, the sixth isolation region 336, the first isolation region contact point 341, the second isolation region contact point 342, the third isolation region contact point 343, the fourth isolation region contact point 344, the fifth isolation region contact point 345, the sixth isolation region contact point 346 and the insulation structure 320 of this embodiment shown in FIG. 3 are similar to the LDMOS device LT, the LDMOS device LT', the first isolation region 231, the second isolation region 232, the third isolation region 233, the fourth isolation region 234, the fifth isolation region 235, the sixth isolation region 236, the first isolation region contact point 241, the second isolation region contact point 242, the third isolation region contact point 243, the fourth isolation region contact point 244, the fifth isolation region contact point 245, the sixth isolation region contact point 246 and the insulation structure 220 of the embodiment shown in FIG. 2B, so the details thereof are not redundantly repeated here. In one embodiment, the current limiting device 351 includes: a Schottky barrier diode (SBD), a resistor device or a PN diode.

Figure 4:
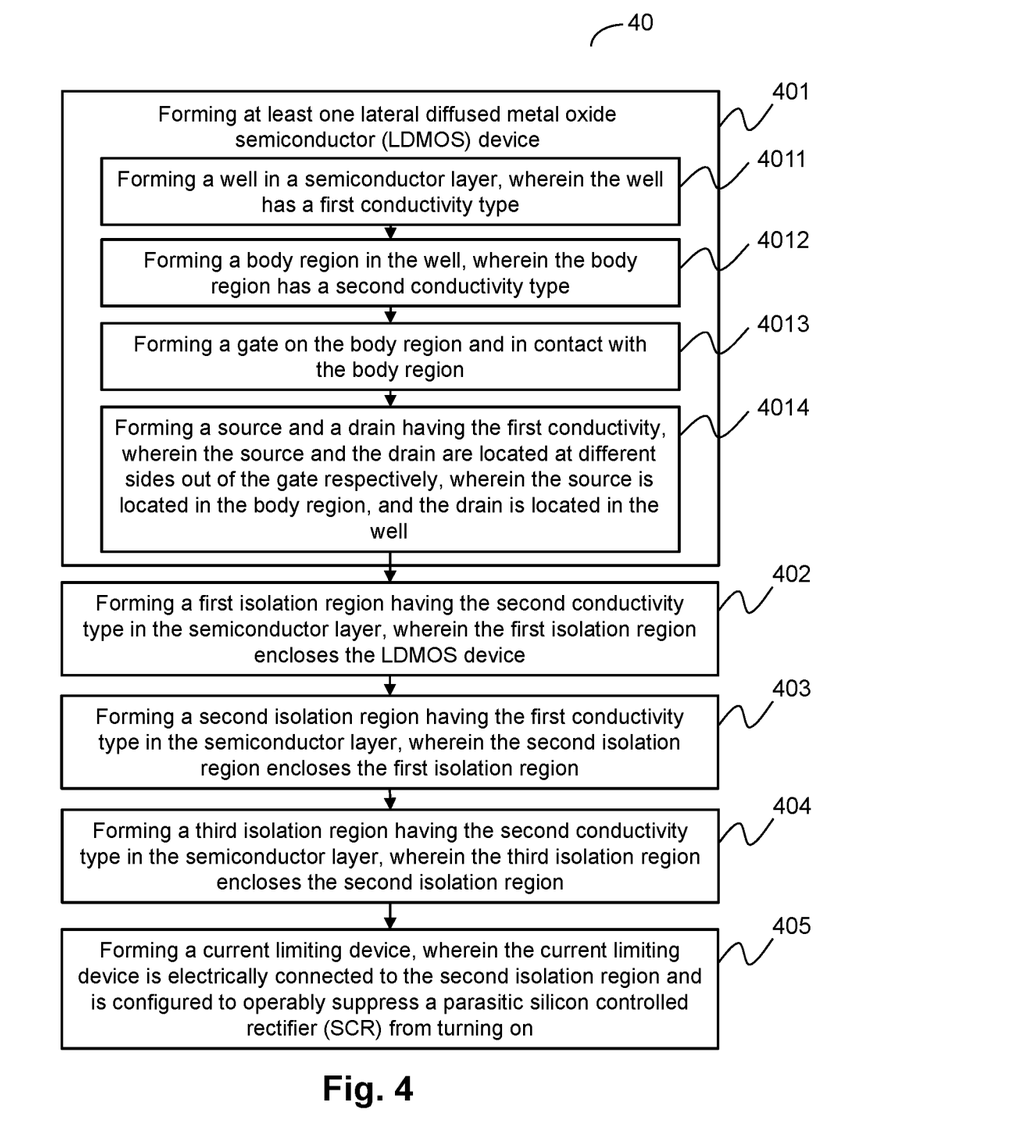
FIG. 4 shows a flowchart diagram of a manufacturing method of a high voltage device.

Please refer to FIG. 4, which shows a flowchart diagram of a manufacturing method of a high voltage device according to the present invention. As shown in FIG. 4, the manufacturing method 40 of a high voltage device, wherein the high voltage device for use as a low-side switch in a power stage of a switching regulator, comprises: step 401: forming at least one lateral diffused metal oxide semiconductor (LDMOS) device, wherein step 401 includes step 4011, step 4012, step 4013 and step 4014. Step 4011: forming a well in a semiconductor layer, wherein the well has a first conductivity type. Next, proceeding to step 4012: forming a body region in the well, wherein the body region has a second conductivity type. Next, proceeding to step 4013: forming a gate on the body region and in contact with the body region. Next, proceeding to step 4014: forming a source and a drain having the first conductivity, wherein the source and the drain are located at different sides out of the gate respectively, wherein the source is located in the body region, and the drain is located in the well. Next, the manufacturing method 40 proceeds to step 402: forming a first isolation region having the second conductivity type in the semiconductor layer, wherein the first isolation region encloses the LDMOS device. Next, the manufacturing method 40 proceeds to step 403: forming a second isolation region having the first conductivity type in the semiconductor layer, wherein the second isolation region encloses the first isolation region. Next, the manufacturing method 40 proceeds to step 404: forming a third isolation region having the second conductivity type in the semiconductor layer, wherein the third isolation region encloses the second isolation region. Next, the manufacturing method 40 proceeds to step 405: forming a current limiting device, wherein the current limiting device is electrically connected to the second isolation region and is configured to operably suppress a parasitic SCR from being turned on.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A high voltage device for use as a low-side switch in a power stage of a switching regulator, the high voltage device comprising:
    at least one lateral diffused metal oxide semiconductor (LDMOS) device, wherein the LDMOS device includes:
        a well, which has a first conductivity type, and is formed in a semiconductor layer;
        a body region, which has a second conductivity type, and is formed in the well;
        a gate, which is formed on the body region and is connected to the body region; and
        a source and a drain, which have the first conductivity type, and are located at different sides out of the gate respectively, wherein the source is located in the body region, and the drain is located in the well; and
    a first isolation region, which has the second conductivity type, and is formed in the semiconductor layer, wherein the first isolation region encloses the LDMOS device;
    a second isolation region, which has the first conductivity type, and is formed in the semiconductor layer, wherein the second isolation region encloses the first isolation region;
    a third isolation region, which has the second conductivity type, and is formed in the semiconductor layer, wherein the third isolation region encloses the second isolation region;
    a current limiting device, which is electrically connected to the second isolation region and which is configured to operably suppress a parasitic silicon controlled rectifier (SCR) from being turned on;
    wherein part of the body region, which is between the source and a boundary of the body region, and is right below the gate, forms an inversion region which serves as an inversion current channel in an ON operation of the LDMOS device;
    wherein part of the well between the body region and the drain is a drift region, which serves as a drift current channel in the ON operation of the LDMOS device.

2. The high voltage device of claim 1, wherein the current limiting device includes: a Schottky barrier diode (SBD), a resistor device or a PN diode.

3. The high voltage device of claim 1, wherein the current limiting device includes a Schottky barrier diode (SBD), and the SBD includes:
    a Schottky metal unit, which is formed on the second isolation region; and
    a Schottky semiconductor unit, which is formed in the second isolation region, wherein a Schottky contact is formed between the Schottky semiconductor unit and the Schottky metal unit, and wherein part of the second isolation region serves as the Schottky semiconductor unit.

4. The high voltage device of claim 3, wherein the second isolation region is a ring-shape region from a top view, and wherein a portion of the ring-shape region which is nearer to a high-side switch in the power stage serves as the Schottky semiconductor unit.

5. The high voltage device of claim 4, wherein the portion is at least ¼ of the ring-shape region.

6. A manufacturing method of a high voltage device, wherein the high voltage device is for use as a low-side switch in a power stage of a switching regulator, the manufacturing method comprising:
    forming at least one lateral diffused metal oxide semiconductor (LDMOS) device, by manufacturing steps including:
        forming a well in a semiconductor layer, wherein the well has a first conductivity type;
        forming a body region in the well, wherein the body region has a second conductivity type;
        forming a gate on the body region and in contact with the body region; and
        forming a source and a drain having the first conductivity, wherein the source and the drain are located at different sides out of the gate respectively, wherein the source is located in the body region, and the drain is located in the well;
    forming a first isolation region having the second conductivity type in the semiconductor layer, wherein the first isolation region encloses the LDMOS device;
    forming a second isolation region having the first conductivity type in the semiconductor layer, wherein the second isolation region encloses the first isolation region;
    forming a third isolation region having the second conductivity type in the semiconductor layer, wherein the third isolation region encloses the second isolation region; and
    forming a current limiting device, wherein the current limiting device is electrically connected to the second isolation region and is configured to operably suppress a parasitic silicon controlled rectifier (SCR) from being turned on;
    wherein part of the body region, which is between the source and a boundary of the body region, and is right below the gate, forms an inversion region which serves as an inversion current channel in an ON operation of the LDMOS device;
    wherein part of the well between the body region and the drain is a drift region, which serves as a drift current channel in the ON operation of the LDMOS device.

7. The manufacturing method of claim 6, wherein the current limiting device includes: a Schottky barrier diode (SBD), a resistor device or a PN diode.

8. The manufacturing method of claim 6, wherein the current limiting device includes a Schottky barrier diode (SBD), and the SBD is formed by manufacturing steps including:
    forming a Schottky metal unit on the second isolation region; and forming a Schottky semiconductor unit in the second isolation region, wherein a Schottky contact is formed between the Schottky semiconductor unit and the Schottky metal unit, and wherein part of the second isolation region serves as the Schottky semiconductor unit.

9. The manufacturing method of claim 8, wherein the second isolation region is a ring-shape region from a top view, and wherein a portion of the ring-shape region which is nearer to a high-side switch in the power stage serves as the Schottky semiconductor unit.

10. The manufacturing method of claim 9, wherein the portion is at least ¼ of the ring-shape region.

* * * * *